United States Patent
Stahlhut

(10) Patent No.: US 11,982,703 B2
(45) Date of Patent: May 14, 2024

(54) METHOD FOR MONITORING A PROTECTIVE DEVICE THAT INCLUDES A SERIES CIRCUIT OF THYRISTORS CONNECTED IN PARALLEL WITH AN ELECTRICAL DEVICE TO BE PROTECTED

(71) Applicant: Siemens Energy Global GmbH & Co. KG, Munich (DE)

(72) Inventor: Nils Stahlhut, Roettenbach (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 0 days.

(21) Appl. No.: 17/866,729

(22) Filed: Jul. 18, 2022

(65) Prior Publication Data
US 2023/0017873 A1    Jan. 19, 2023

(30) Foreign Application Priority Data
Jul. 16, 2021 (EP) ..................... 21185964

(51) Int. Cl.
*G01R 31/26* (2020.01)
*H02H 3/20* (2006.01)

(52) U.S. Cl.
CPC .............. *G01R 31/263* (2013.01); *H02H 3/20* (2013.01)

(58) Field of Classification Search
CPC .............. G01R 31/263; G01R 31/2827; G01R 19/0038; G01R 23/005; G01R 31/52; G01R 31/327; G01R 19/16523; G01R 19/1659; H02M 1/34; H02M 7/003; H02M 7/7575; H02M 7/162; H02M 3/07; H02M 7/521; H02M 7/53871; H02H 3/023;
(Continued)

(56) References Cited

U.S. PATENT DOCUMENTS 4,133,018 A * 1/1979 Terunuma .............. G01R 29/18 340/645
4,471,301 A * 9/1984 Durov .................. G01R 31/263 340/645
(Continued)

FOREIGN PATENT DOCUMENTS

DE    3627114 A1    2/1988
EP    0249123 A1    12/1987
(Continued)

OTHER PUBLICATIONS

Anonymous: "IEEE Standard for Series Capacitor Banks 10 in Power Systems"; IEEE Std 824-2004 (Revision of IEEE Std 824-1994) ED; IEEE Standard; [IEEE Standard], IEEE, Piscataway, NJ, USA; Jan. 1, 2005 (Jan. 1, 2005), pp. 1-53, XP017694292.

*Primary Examiner* — Vinh P Nguyen
(74) *Attorney, Agent, or Firm* — Laurence A. Greenberg; Werner H. Stemer; Ralph E. Locher

(57) ABSTRACT

A method for monitoring a protective device, which has a series circuit of a multiplicity of thyristors. The protective device has a series circuit of N>1 thyristors. The series circuit is connected in a parallel circuit with an electrical device to be protected. A snubber branch is connected in parallel with each thyristor. For the purpose of testing a firing capacity, n<N thyristors in a first thyristor group are fired when a positive voltage is present across the series circuit and a negative snubber current is flowing through the snubber branches of the thyristors in the first thyristor group.

12 Claims, 3 Drawing Sheets

(58) Field of Classification Search
CPC .......... H02H 3/044; H02H 3/048; H02H 3/20; H02H 7/1225; H02H 7/1227; H02H 9/02; H02H 9/021; H02H 9/04; H02H 6/00; H02H 7/0844
See application file for complete search history.

(56) References Cited

U.S. PATENT DOCUMENTS

| | | | | | |
|---|---|---|---|---|---|
| 4,589,050 | A | * | 5/1986 | Cutler | H02M 7/1623 363/54 |
| 4,675,800 | A | * | 6/1987 | Seki | H02M 1/088 363/136 |
| 4,884,025 | A | * | 11/1989 | Hausler | H02M 1/088 363/68 |
| 5,521,526 | A | * | 5/1996 | Nyberg | G01R 31/263 324/762.01 |
| 5,731,967 | A | * | 3/1998 | Gruning | H02M 7/519 363/57 |
| 6,009,008 | A | * | 12/1999 | Pelly | H02M 7/125 363/125 |
| 9,746,513 | B2 | * | 8/2017 | Geske | G01R 31/263 |

FOREIGN PATENT DOCUMENTS

| | | | |
|---|---|---|---|
| EP | 2937705 | A1 | 10/2015 |
| WO | WO 9406028 | A1 | 3/1994 |

\* cited by examiner

US 11,982,703 B2

METHOD FOR MONITORING A PROTECTIVE DEVICE THAT INCLUDES A SERIES CIRCUIT OF THYRISTORS CONNECTED IN PARALLEL WITH AN ELECTRICAL DEVICE TO BE PROTECTED

CROSS-REFERENCE TO RELATED APPLICATION

This application claims the priority, under 35 U.S.C. § 119, of European Patent Application EP 21185964.0, filed Jul. 16, 2021; the prior application is herewith incorporated by reference in its entirety.

FIELD AND BACKGROUND OF THE INVENTION

The invention relates to a method for monitoring a protective device, which has a series circuit of a multiplicity of thyristors.

It is known to use thyristors to protect electrical devices. A series circuit of thyristors together with an associated circuitry is often referred to as a thyristor valve. Such thyristor valves in protective applications are characterized by the fact that, in general, they are arranged in parallel with the operating devices that are to be protected and they conduct the operating current only in the event of a fault or temporarily. The voltage present across the thyristors corresponds in terms of form to the line voltage and is approximately sinusoidal. The blocking properties of the thyristors can be monitored continuously using individual thyristor voltages. Defective semiconductors can be detected at any time.

SUMMARY OF THE INVENTION

The object of the invention is to provide a method of the generic type with which an improved monitoring of the protective device is made possible.

With the above and other objects in view there is provided, in accordance with the invention, a method for monitoring a protective device, the protective device having a series circuit of N>1 thyristors connected in parallel with an electrical device to be protected, and a snubber branch connected in parallel with each thyristor, the method which comprises:
testing a firing capacity by firing a number n<N thyristors in a first thyristor group when:
a positive voltage is present across the series circuit of thyristors; and
a negative snubber current is flowing through the snubber branches of the thyristors in the first thyristor group In other words, the above and other objects are achieved by a method for monitoring a protective device, which has a series circuit of N>1 thyristors which is connected in a parallel circuit with an electrical device to be protected, wherein a snubber branch is connected in parallel with each thyristor, in which method, for the purpose of testing a firing capacity, n<N thyristors in a first thyristor group are fired when a positive voltage is present across the series circuit, and a negative snubber current is flowing through the snubber branches of the thyristors in the first thyristor group (this snubber current can also be referred to as first snubber current). The number N of thyristors can vary depending on the application, likewise the number n of thyristors in the first thyristor group. The snubber branch for each thyristor suitably comprises a so-called snubber group, which can have, for example, an RC snubber, which is used for damping switching operations. The protective device expediently comprises at least one firing circuit, which is provided for firing the thyristors in the series circuit. The firing circuit can enable, for example, electrical firing or light pulse firing. The polarity of the voltage across the series circuit (positive or negative) is based on the forward direction of the thyristors in the series circuit, within the meaning of the invention. This also applies for the current. The monitoring firings are expediently triggered at a time at which the respective firing conditions at the thyristors under consideration are met (voltage positive, current in snubber branch negative). These conditions are met, for example, between a positive peak and a zero crossing of a terminal voltage present across the series circuit. In applications involving a use of thyristors back-to-back in parallel, the series circuit can also be referred to as the first series circuit.

The invention advantageously makes it possible to test or monitor the firing capacity of the protective device without the protective device being disconnected, i.e., during running operation. The firing capacity of each individual thyristor can be monitored when there is an operating voltage present, but without operating current. Accordingly, by virtue of the invention, the availability of the protective device (in particular of the thyristor valve) can be increased since thereby overall the entire drive path up to the power semiconductor (thyristor) can be monitored continuously. The required hardware components are generally already provided; it is only necessary for implementation and protection of the operation to take place using open-loop/closed-loop control, with the result that the method is implementable in a simple and cost-effective manner.

Preferably, temporally after the firing of the first thyristor group, m<N thyristors in a second thyristor group are fired when a positive voltage (which can also be referred to as second group voltage) is present across the second thyristor group, and a negative snubber current is flowing through the snubber branches of the thyristors in the second transistor group (this snubber current can also be referred to as second snubber current). Preferably, this is performed within the same voltage half-cycle. Preferably, the thyristors in the second thyristor group are fired when a non-negative voltage is present across the series circuit (which voltage can moreover also be referred to as terminal voltage). The firing of the thyristors in the second thyristor group can take place in particular when the terminal voltage passes through its zero crossing or is at the zero crossing. The number n and the number m can be selected in such a way that n+m=N, which is not necessary, however. It is only necessary to ensure that the voltage present across the series circuit can be maintained at the time of firing by the unfired or non-activated thyristors. The thyristor groups (or the thyristors therein) of the thyristor valve are therefore fired separately from one another without the entire series circuit or the entire thyristor valve becoming completely conductive. The switching-on of the thyristors can be detected in principle, for example, by detection of undershooting of fixed voltage thresholds, suitably within a predefined time window.

Suitably, each thyristor in the series circuit is assigned to one of i>1 thyristor groups each having ni thyristors, wherein all of the thyristor groups are fired temporally one after the other. In this way, monitoring of all of the thyristors is enabled. Preferably, the number ni of thyristors in all of the thyristor groups is identical.

In accordance with one embodiment of the invention, the method is performed repeatedly at a time interval of at least 1 h (one hour). For some applications, repetition at intervals of a day can be suitable. For some applications, repetition on demand can be suitable. In this way, relatively continuous monitoring of the functionality of the protective device is enabled.

Preferably, information on a firing result is communicated to a monitoring unit, and, in the event of a detected malfunction of one of the thyristors (including a malfunction of an associated firing arrangement), a fault message is generated. The firing result is positive in the case of successful firing of the thyristor in question or else in the case of successful firing of the entire thyristor group. In the case of a negative firing result, the malfunction can be established. The information on the switching-on or non-switching-on of a thyristor is passed on, for example, from a monitoring unit (for example a thyristor voltage monitoring unit, TVM unit) via optical waveguides to an evaluation unit (for example valve-base electronics), preferably arranged at ground potential, and evaluated there.

In accordance with one embodiment of the invention, the protective device comprises a further series circuit of N thyristors, wherein the thyristors in the series circuit and the thyristors in the further series circuit are arranged back-to-back in parallel with one another. Owing to this arrangement, the protective device is designed for protection irrespective of the direction of current flow. The method can also be used in respect of the further series circuit, with the result that the thyristors which are back-to-back in parallel can also be monitored for their firing capacity. For the purpose of testing their firing capacity, p<N thyristors in a further thyristor group in the further series circuit can be fired when a negative voltage is present across the further series circuit, and a positive (first) snubber current is flowing through the snubber branches of the thyristors in the further thyristor group (the snubber branches of the thyristors in the further thyristor group are suitably identical to the snubber branches of the thyristors in the first thyristor group). The voltage and the current should in this case, in order to avoid ambiguity, be understood again in respect of the forward direction of the thyristors in the first series circuit. The thyristors in the further series circuit can be split, for example, among a plurality of thyristor groups, and these are fired one after the other, preferably as previously described in respect of the series circuit (or the first and second thyristor groups). The testing of the firing capacity of the thyristors in the further series circuit is, however, not performed at the same time as the testing of the firing capacity of the thyristors in the series circuit, but rather, for example, in successive system periods.

In accordance with one embodiment of the invention, the thyristors are fired by means of light pulse firing. In this variant, advantageously the entire signal path including the thyristor can be monitored.

Preferably, the electrical device is a short circuit current limiter (SCCL) or a capacitive compensation device (TPSC, thyristor protected series capacitor). These devices are particularly system-critical, so that an increase in their reliability owing to the improved protection by means of the protection device and therefore also by means of the method according to the invention is particularly advantageous.

Other features which are considered as characteristic for the invention are set forth in the appended claims.

Although the invention is illustrated and described herein as embodied in a method for monitoring a protective device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
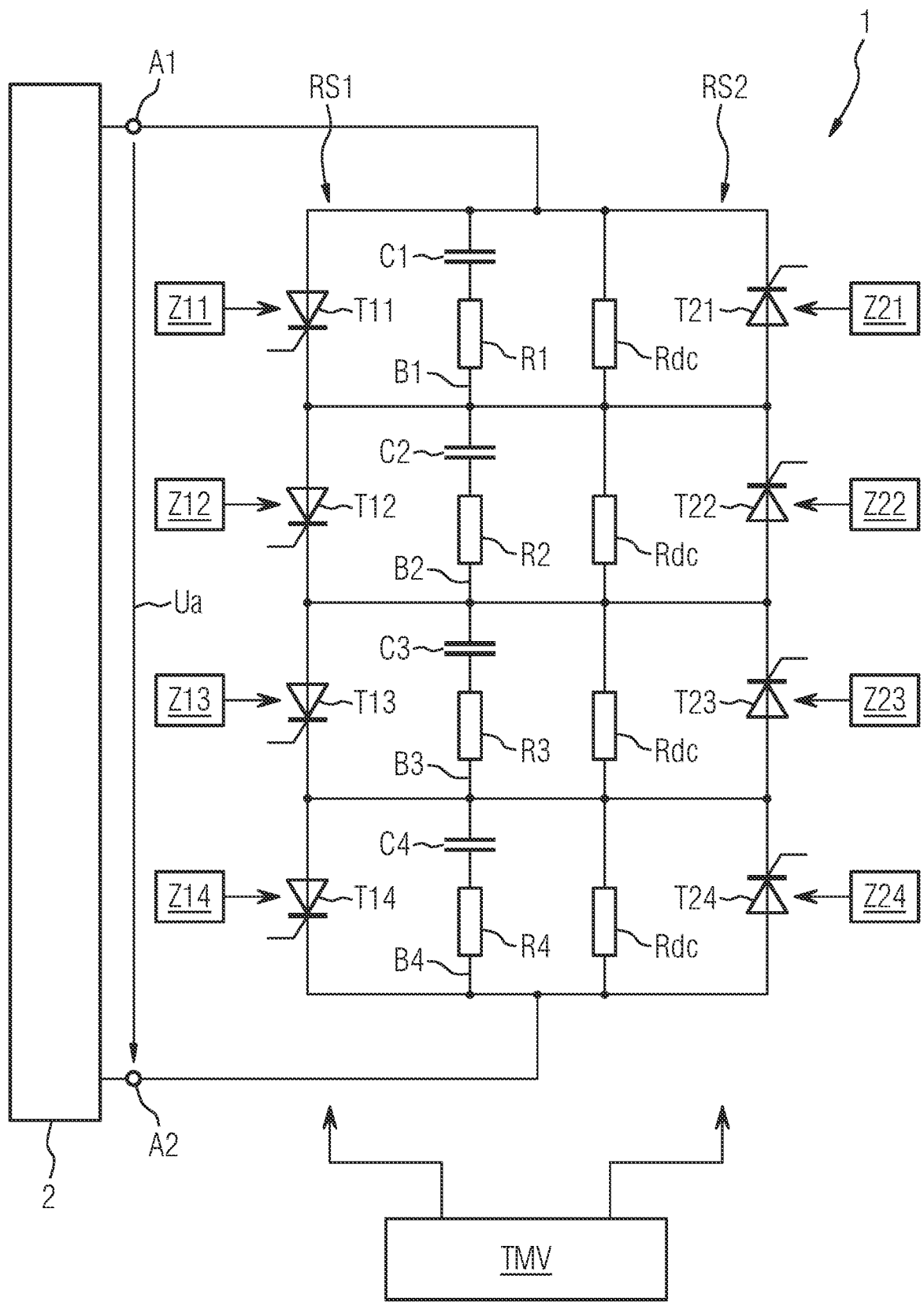
FIG. 1 shows a protective device in a schematic illustration.

Referring now to the figures of the drawing in detail and first, in particular, to FIG. 1 thereof, there is shown a protective device 1. The protective device 1 is used for protecting an electrical device 2, wherein the protective device 1 is arranged in a parallel circuit with the electrical device 2 to be protected and is connected thereto via terminals A1 and A2. A terminal voltage present between the two terminals A1, A2 is denoted Ua. In the event of a fault, the protective device 1 is intended to take on a fault current through the device 2. For this purpose, the protective device 1 comprises thyristors T11-T14, which form a series circuit RS1, and T21-T24, which form a further series circuit RS2, which thyristors can be fired in the event of a fault. In this case, the thyristors T11-T14 are connected back-to-back in parallel with the thyristors T21-T24, with the result that the protective device can exert its protective function independently of the direction of current flow. A snubber branch (snubber element) B1-B4 is assigned to each thyristor T11-T14 or each thyristor pair T11/T21-T14/T24 which is back-to-back in parallel. The snubber branches B1-B4 are connected in series with one another and each is connected in parallel with the thyristors. Each of the snubber branches comprises a capacitance element C1-C4, respectively, and a resistance element R1-R4, respectively.

In order to fire the thyristors T11-T24, firing circuits Z11-Z24 are provided. The thyristors T11-T24 and in particular a thyristor voltage present in each case across the thyristors T11-T24 are monitored by way of a monitoring unit TVM.

In the example illustrated in FIG. 1, the thyristors T11, T12 form a first thyristor group, the thyristors T13, T14 form a second thyristor group, the thyristors T21, T22 form a third thyristor group, and the thyristors T23, T24 form a fourth thyristor group.

In each case one DC grading resistor Rdc is arranged in parallel with each snubber branch B1-B4. The DC grading resistor Rdc is a high-resistance resistor which serves the purpose of suppressing DC shifts in the long term.

Figure 2:
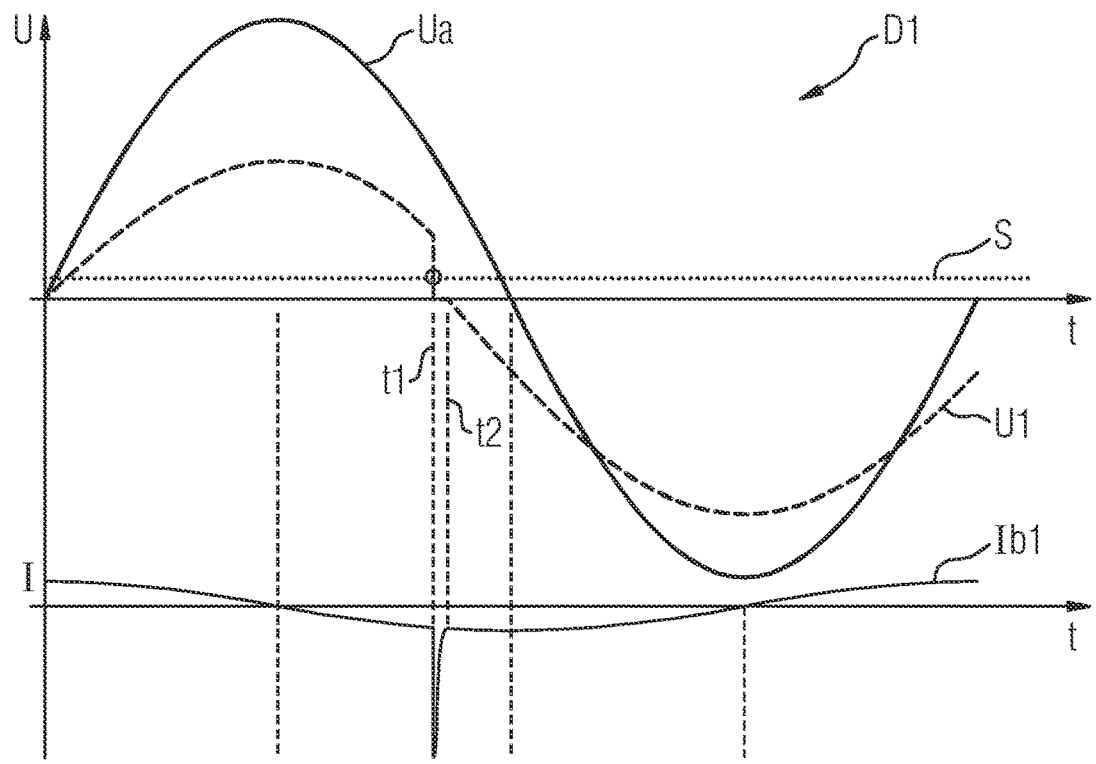
FIGS. 2 and 3 show respective graphs of characteristics for voltage and current in connection with a first variant of the method according to the invention.

The procedure in one embodiment of the method according to the invention will now be described with reference to a graph D1 in FIG. 2. Graph D1 shows a horizontal time axis t and a vertical voltage or current axis U or I. The characteristic (over time) of the terminal voltage is denoted by Ua. The characteristic of a first group voltage which is present across the first thyristor group T11, T12 is denoted by U1. A current through the snubber branches B1, B2 is denoted by Ib1.

In order to test the firing capacity of the thyristors T11, T12 in the first thyristor group, they are fired at time t1. At this time, the terminal voltage Ua is positive, the current Ib1 through the snubber branches (first snubber current) is negative. Correspondingly, the capacitance elements C1 and C2 are discharged via the fired thyristors T11 and T12 since they are now short-circuited. The negative first snubber current Ib1 is therefore superimposed by a discharge current which is positive based on the forward direction of the thyristors T11, T12 and is caused by the discharge of the capacitance elements C1, C2. The first group voltage U1 decreases and in this case undershoots a monitoring threshold, which is identified by a dotted line S. The undershooting of the monitoring threshold can be detected so that a corresponding message can be generated to the effect that the firing was successful. At a time t2, the discharge current decays so far that the thyristors T11, T12 turn off.

Figure 3:
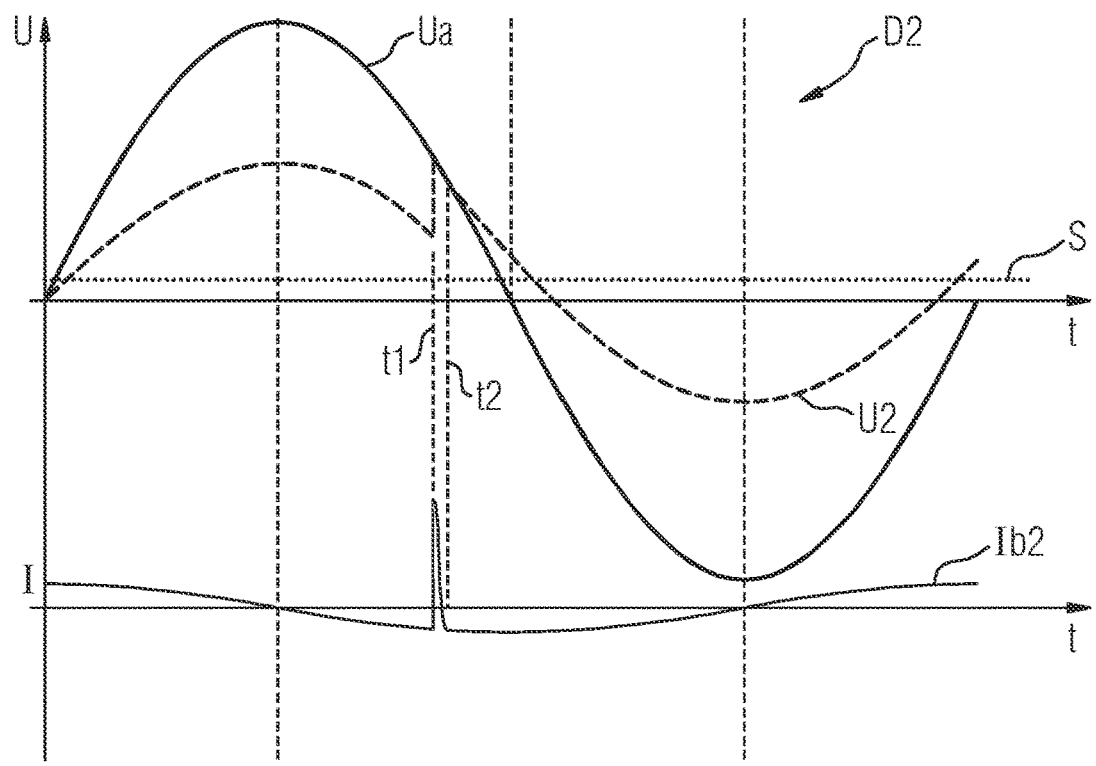

The graph D2 in FIG. 3 shows a horizontal time axis t and a vertical voltage or current axis U or I. The characteristic (over time) of the terminal voltage is denoted by Ua. The characteristic of a second group voltage present across the second thyristor group T13, T14 is denoted by U2. A current through the snubber branches B3, B4 is denoted by Ib2 (second snubber current). Since, in accordance with the example shown in FIGS. 1 to 3, the thyristors T11-T24 are of similar design and, in addition, all of the thyristor groups comprise the same number of thyristors, the group voltages U1 and U2 correspond to one another up to a time t1.

It can also be seen that the group voltages U1 and U2 are different after time t2. Owing to the firing of the first thyristor group T11, T12, the second group voltage U2 is increased in correspondingly stepwise fashion since now the entire terminal voltage Ua is present across the thyristors T13, T14 in the thyristor group. The rise in the second group voltage U2 in comparison with the first group voltage U1 can lead, inter alia, to an overvoltage.

Figure 4:
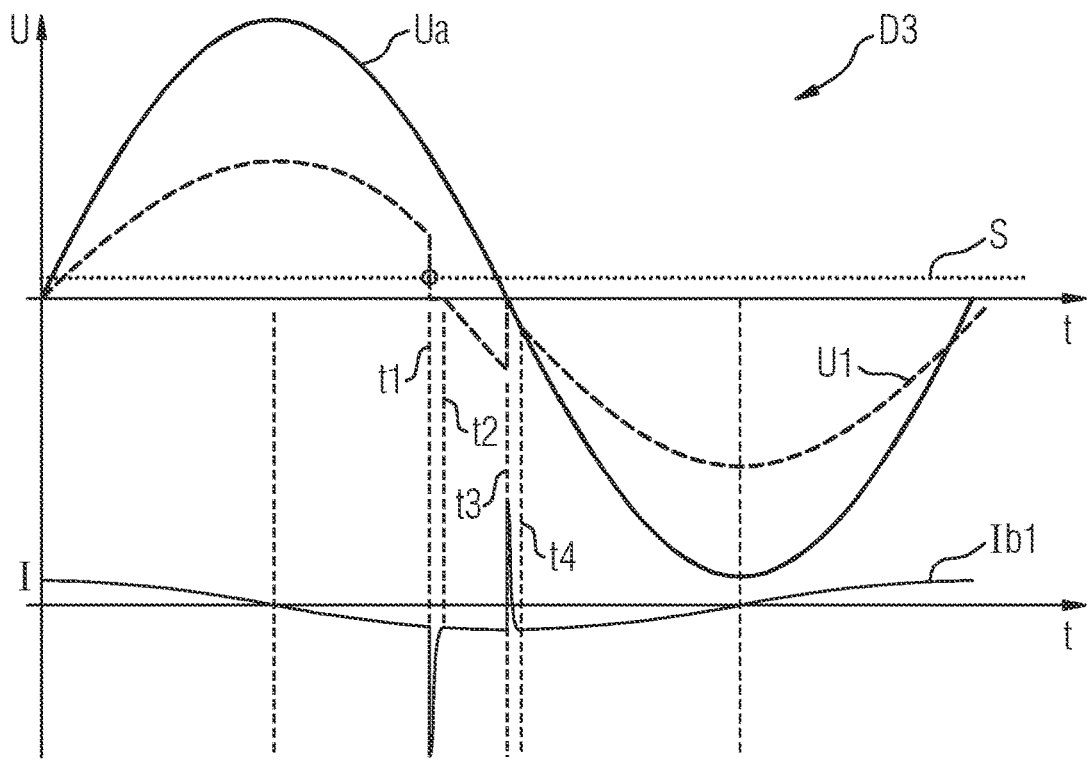
FIGS. 4 and 5 show respective graphs of characteristics for voltage and current in connection with a second variant of the method according to the invention.
Figure 5:
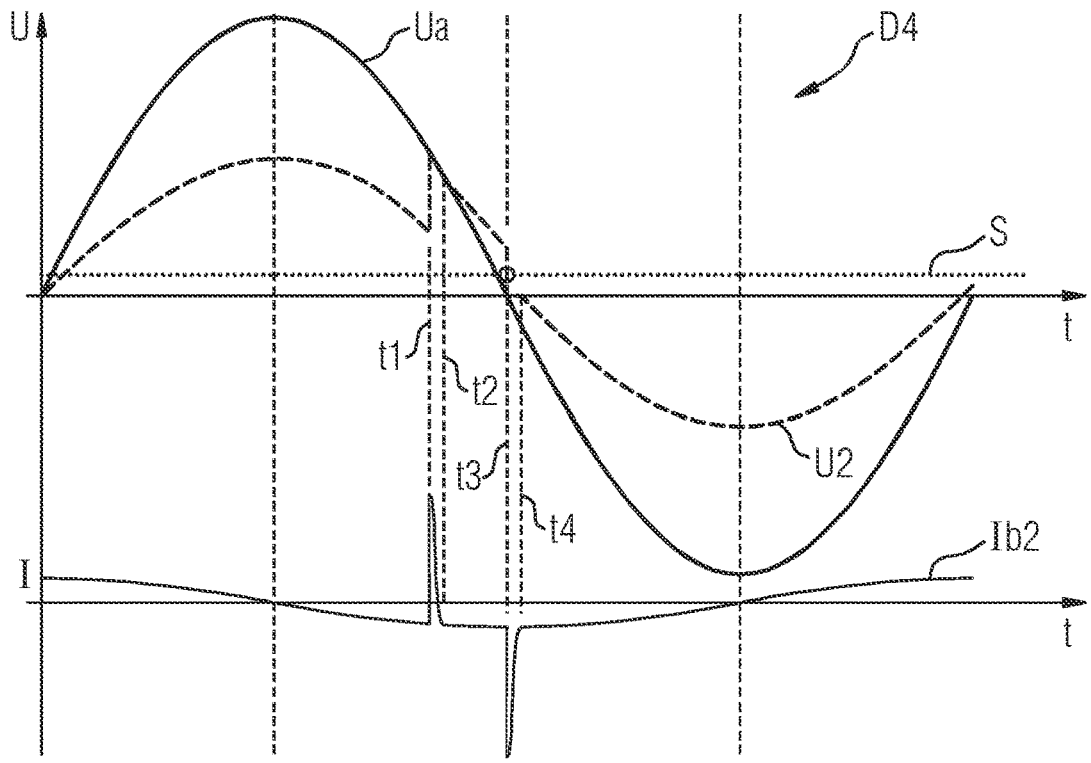

FIGS. 4 and 5 show an advantageous variant of the method. In this case, identical and similar elements in FIGS. 2 to 5 are provided with the same reference symbols for reasons of improved clarity. As described previously, the thyristors T11 and T12 are fired at time t1. In accordance with the variant in FIGS. 4 and 5, at a time t3 (second group voltage U2 is positive, second snubber current Ib2 is negative) in addition the thyristors T13 and T14 are also fired. As the thyristors T13, T14 in the second thyristor group are fired, the group voltage U2 decreases suddenly (cf. FIG. 5). This can be used to test the firing capacity of the thyristors T13, T14 in the second thyristor group (in particular using a comparison with the monitoring threshold S). As a result, in addition the characteristics of the two group voltages U1 and U2 are virtually identical after a time t4 at which the thyristors T13, T14 in the second thyristor group turn off. The risk of an overvoltage can in this way advantageously be reduced.

Monitoring of the firing capacity of the thyristors of the further series circuit RS2 can be performed in a similar way to the previously described procedure. In this case, the thyristors T21-T24 in the third and fourth thyristor groups are fired once the testing of the firing capacity of the thyristors in the series circuit RS1 has been performed, for example during the following system periods. It should be noted in this case that, for this purpose, both the voltage and the snubber current need to have a suitable polarity.

The invention claimed is:

1. A method for monitoring a protective device, the protective device having a series circuit of N>1 thyristors connected in parallel with an electrical device to be protected, and a snubber branch connected in parallel with each thyristor, the method which comprises:
    firing a number n<N thyristors in a first thyristor group when:
        a positive voltage is present across the series circuit of thyristors; and
        a negative snubber current is flowing through the snubber branches of the thyristors in the first thyristor group;
    detecting a switching-on or non-switching-on of at least one of the thyristors of the n<N thyristors in the first thyristor group in response to the firing; and
    establishing a malfunction of at least one thyristor if non-switching-on of at least one of the thyristors was detected.

2. The method according to claim 1, further comprising the steps of, temporally subsequent to firing the first thyristor group:
    firing m<N thyristors in a second thyristor group when:
        a positive voltage is present across the second thyristor group; and
        a negative snubber current is flowing through the snubber branches of the thyristors in the second thyristor group;
    detecting a switching-on or non-switching-on of at least one of the m<N thyristors in the second thyristor group in response to the firing; and
    establishing a malfunction of the at least one of the m<N thyristors if non-switching-on of the at least one if the m<N thyristors was detected.

3. The method according to claim 2, which comprises firing the thyristors of the second thyristor group within a same voltage half-cycle as firing the thyristors of the first thyristor group.

4. The method according to claim 1, wherein each thyristor in the series circuit is assigned to one of i>1 thyristor groups each having ni thyristors, and the method further comprises, after the firing of the n<N thyristors of the first thyristor group, firing all remaining thyristor groups temporally one after another to detect switching-on or non-switching-on of thyristors in the remaining thyristor groups.

5. The method according to claim 4, wherein the number ni of thyristors in all of the thyristor groups is identical.

6. The method according to claim 1, which comprises repeatedly performing the method at a time interval of at least one hour.

7. The method according to claim 1, which comprises communicating information a switching-on or non-switching-on of at least one of the thyristors to a monitoring unit, and, if a malfunction of one of the thyristors is detected, generating a fault message.

8. The method according to claim 1, wherein the protective device comprises a further series circuit of N thyristors, and wherein the thyristors in the series circuit and the thyristors in the further series circuit are arranged back-to-back in parallel with one another.

9. The method according to claim 8, further comprising the steps of:
    firing p<N thyristors in a further thyristor group in the further series circuit when:
        a negative voltage is present across the further series circuit; and a positive snubber current is flowing through the snubber branches of the thyristors in the further thyristor group; and detecting a switching-on or non-switching-on of at least one of the p<N thyristors in the further thyristor group in response to the firing.

10. The method according to claim 9, which comprises firing the thyristors by light pulse firing.

11. The method according to claim 1, which comprises firing the thyristors by light pulse firing.

12. The method according to claim 1, wherein the electrical device is a short circuit current limiter or a capacitive compensation device.

* * * * *